United States Patent
Landau

(10) Patent No.: US 6,372,607 B1
(45) Date of Patent: Apr. 16, 2002

(54) PHOTODIODE STRUCTURE

(75) Inventor: Berni W. Landau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/343,841

(22) Filed: Jun. 30, 1999

(51) Int. Cl.[7] .......................... H01L 21/76; H01L 21/00
(52) U.S. Cl. ........................ 438/439; 438/48; 438/22; 438/45; 438/414; 438/449
(58) Field of Search ............................ 438/22, 45, 380, 438/148, 221, 48, 141, 142, 545, 20, 530, 133, 437, 414, 439, 440, 441, 442, 447, 449; 257/431, 437

(56) References Cited

U.S. PATENT DOCUMENTS

| 4,125,415 A | * | 11/1978 | Clark .......................... 438/133 |
| 4,240,843 A | * | 12/1980 | Celler et al. ................. 438/530 |
| 4,370,797 A | * | 2/1983 | Van Gorkom et al. ........ 438/20 |
| 4,473,941 A | * | 10/1984 | Turi et al. .................... 438/380 |
| 4,577,394 A | * | 3/1986 | Peel ............................ 438/439 |
| 5,089,427 A | * | 2/1992 | Schoenberg ................. 438/545 |
| 5,114,868 A | * | 5/1992 | Yoshida ........................ 437/34 |
| 5,789,286 A | * | 8/1998 | Subbanna ..................... 438/221 |
| 5,804,470 A | * | 9/1998 | Wollesen ...................... 438/141 |
| 6,051,874 A | * | 4/2000 | Masuda ........................ 257/594 |
| 6,165,822 A | * | 12/2000 | Okumo et al. ............... 438/142 |
| 6,197,649 B1 | * | 3/2001 | Francis et al. ............... 438/380 |
| 6,215,165 B1 | * | 4/2001 | Connolly et al. ............ 257/437 |
| 6,259,145 B1 | * | 7/2001 | Connolly et al. ............ 257/431 |

FOREIGN PATENT DOCUMENTS

| JP | 4051829958 A | * | 7/1993 | .................. 21/316 |
| JP | 405259451 A | * | 10/1993 | .................. 29/784 |
| JP | 405283404 A | * | 10/1993 | .................. 21/316 |
| JP | 405326497 A | * | 10/1993 | .................. 21/316 |
| JP | 406120490 A | * | 4/1994 | .................. 29/784 |
| JP | 406151775 A | * | 5/1994 | ..................... 27/11 |
| JP | 406177124 A | * | 6/1994 | .................. 21/316 |

* cited by examiner

Primary Examiner—Matthew Smith
Assistant Examiner—Chuong Anh Luu
(74) Attorney, Agent, or Firm—Blakely, Sokoloff, Taylor & Zafman LLP

(57) ABSTRACT

A circuit that includes an isolation boundary formed to a depth in a substrate defining an active area of the substrate, a primary junction formed in the active area to a primary junction depth in the substrate to collect electron/hole pairs, and a secondary junction formed in the active area adjacent to the isolation boundary to a secondary junction depth at least equal to the isolation boundary depth.

4 Claims, 2 Drawing Sheets

PHOTODIODE STRUCTURE

BACKGROUND OF THE INVENTION

1. Field of the Invention

The invention relates to digital imaging devices and, more particularly, to image sensing devices.

2. Description of Related Art

Image sensing devices are the light detecting components in digital imaging systems, such as for example, digital cameras and copiers. A digital image sensing device, such as a camera, uses light to capture an image typically by a semiconductor-based chip. The chip replaces film in traditional film-based systems. In a camera, an image sensing device is configured, in its simplest form, to capture a monochrome or color image by way of semiconductor devices such as transistors, capacitors, and photodiodes. In one example, the image sensing device is a chip made up of a number of pixels, each pixel capable of absorbing light. In color applications, each pixel generally absorbs light through a filter and represents one color corresponding to the image sensed.

In general, a pixel contains a photosensing structure, such as a photodiode, and other pixel circuitry. The photosensing structure is the region of the pixel that responds to light. In one example, a pixel circuit having a photodiode is charged to a predetermined voltage. The photodiode is exposed to light and a pixel circuit discharges its stored energy depending on the intensity of the light exposure.

The photodiode of a complementary metal oxide semiconductor (CMOS) imaging sensing array is typically reverse-biased. Under this condition, the photodiode is designed to block current flow as long as the voltage stays below a specified value. The specified value is exceeded upon the signaling of an electronic shutter. Under reverse-biased conditions, incoming photons strike a photodiode area and electron/hole pairs are generated through a junction in the semiconductor substrate. The electrons are collected as a signal representative of the light exposure. The signal gets transferred into image information upon the operation of the electronic shutter, e.g., sending a signal exceeding a predetermined voltage value.

One problem with many prior art photodiode architectures is that, under reverse-biased conditions, a small current, identified as a leakage current, generally flows across the junction. This electron flow acts as noise and may be referred to as a "dark current." Under the conditions where the photodiode is not exposed to light there is a base line level of dark current equivalent to a reverse saturation leakage current. It would be desirable to reduce or eliminate this leakage current.

SUMMARY OF THE INVENTION

A circuit including an isolation boundary formed to a depth in a substrate defining an active area of the substrate, a primary junction formed in the active area to a primary junction depth in the substrate to collect electron/hole pairs, and a secondary junction formed in the active area adjacent the isolation boundary to a secondary junction depth at least equal to the isolation boundary depth.

BRIEF DESCRIPTION OF THE DRAWINGS

The features, aspects, and advantages of the invention will become more thoroughly apparent from the following detailed description, appended claims, and accompanying drawings in which:

DETAILED DESCRIPTION OF THE INVENTION

The invention relates to a circuit and a method of forming a circuit that has a junction to collect electron/hole pairs.

The invention reduces the amount of leakage current occasioned with conventional photodiode structures by incorporating a buffer region adjacent an isolation boundary that defines an active area for the circuit.

Figure 1:
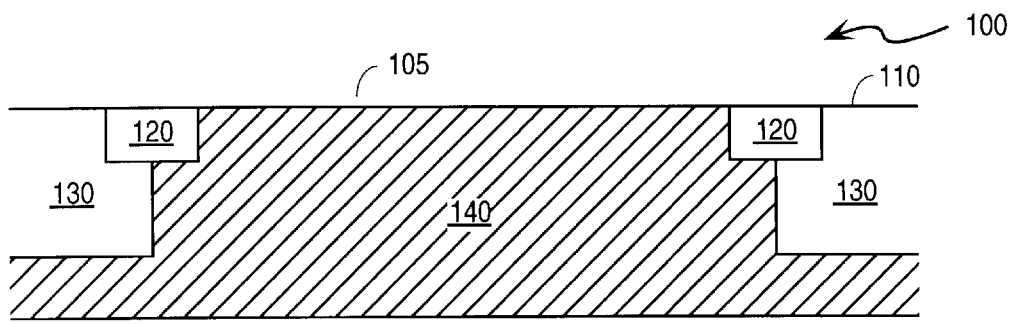
FIG. 1 shows a schematic cross-sectional side view of a portion of a semiconductor substrate including an active area defined by trench isolation structures.

FIGS. 1–4 illustrate one method of forming a circuit according to the invention. In FIGS. 1–4, an N-P photodiode circuit is formed. As shown in FIG. 1, an active area of P-type semiconductor substrate 110 is defined by the formation of an isolation boundary. In the example described, the isolation boundaries constitutes shallow trench isolation (STI) isolation a boundaries 120 formed in substrate 110, such as a silicon substrate. STI isolation boundaries 120 may be formed according to current processing techniques. STI isolation boundaries 120 define active area 105. Adjacent active area 105 are P-type wells 130 formed according to current processing techniques, for example, by high-energy implantation of boron (B).

P-type depletion region 140 is formed to a desired depth in active area 105 a P-type substrate. In one embodiment, depletion region 140 is a P-type epitaxial (EPI) region grown to a thickness of approximately 2.75 $\mu$m according to current process technology. Diffusion from the P-type substrate 110 (e.g., boron diffusion) into the epitaxial region can reduce this thickness. Targeting a thickness of, for example, approximately 2.5 $\mu$m, may be accomplished by depositing epitaxial silicon to a greater thickness (e.g., 3.75 $\mu$m) and accounting for diffusion.

Figure 2:
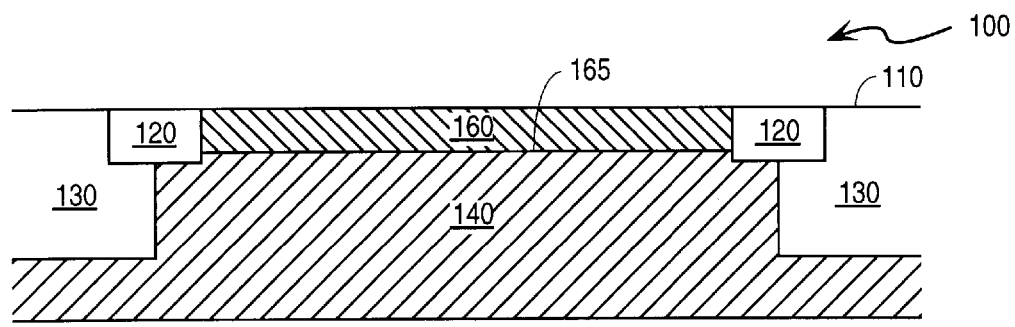
FIG. 2 shows the substrate of FIG. 1 after the step of forming a junction in the active area of the substrate.

FIG. 2 shows the substrate of FIG. 1 after the further processing step of incorporating an N-type dopant to form N-type diffusion region 160 into the surface of P-type substrate 110 in active area 105. In one embodiment, the dopant has a concentration equivalent to a tip or lightly doped drain implant. One example is the implantation of phosphorous at a concentration of $1 \times 10^{17}$–$5 \times 10^{18}$ atoms/cm$^3$ at an energy of 2–35 kiloelectron-volts to form N-type region 160. It is to be appreciated that other dopant concentrations and energy levels may also be used, such as a source/drain concentration and energy level to form N-type diffusion region 160. The incorporation of N-type diffusion region 160 defines junction 165 between N-type diffusion region 160 and P-type depletion region 140.

In one embodiment, junction 165 is formed such that there is established a diffusion length or depth that a photon of light will travel in silicon before generating an electron/hole pair and any recombination of the electron/hole pair or photon having a wavelength corresponding to the spectral regions of Red, Green, or Blue (RGB) wavelengths will occur within depletion region 140. In this manner, depletion region 140 collects the electrons generated by the photons striking the semiconductor and can emit a suitable signal representative of the incoming light striking the semiconductor. Techniques for forming such a photodiode structure are known in the art.

The invention recognizes that there are interface states present in active area 105 adjacent STI isolation boundaries 120 that contribute to leakage current. By enveloping STI isolation boundaries 120 with N-type dopant in active area 105, the level of leakage current can be reduced. One proposal to reduce the amount of leakage current present in a photodiode structure such as shown, for example, in FIG. 2 is to extend the depth of junction 165 below STI isolation boundaries 120, thus enveloping STI isolation boundaries 120 in active area 105. In such manner, N-type dopant would envelope the lateral and vertical components of STI isolation boundaries 120. One problem with this proposal is that light in the Blue wavelength does not travel as far as light in the other wavelengths (e.g., Red and Green). Light in the Blue wavelength may therefore generate electron/hole pairs in N-type diffusion region 160 and recombine before junction region 165. Such a situation could result in the failure of the photodiode to detect sufficient light in the Blue wavelength thus reducing the quantum efficiency of the photodiode.

Ideally, electron/hole pairs generated in active area 105 and substrate 110 should be generated within the confines of depletion region 140 or within a diffusion length of depletion region 140. Accordingly, depletion region 140 should be formed such that it is close to the surface to catch the entire optical signal, including light having a Blue wavelength. Further, to achieve maximum quantum efficiency, depletion region 140 should have as shallow a depth as possible and a maximum surface area.

To meet the requirement of a shallow depletion region having a maximum surface area, the invention contemplates the formation of a buffer region adjacent STI isolation boundaries 120 in active area 105 of substrate 110. In one embodiment, the buffer region is an N-type doped region implanted adjacent STI isolation boundaries 120 that extends the vertical distance of STI isolation boundaries 120 into substrate 110 as well as the lateral distance of active area 105.

Figure 3:
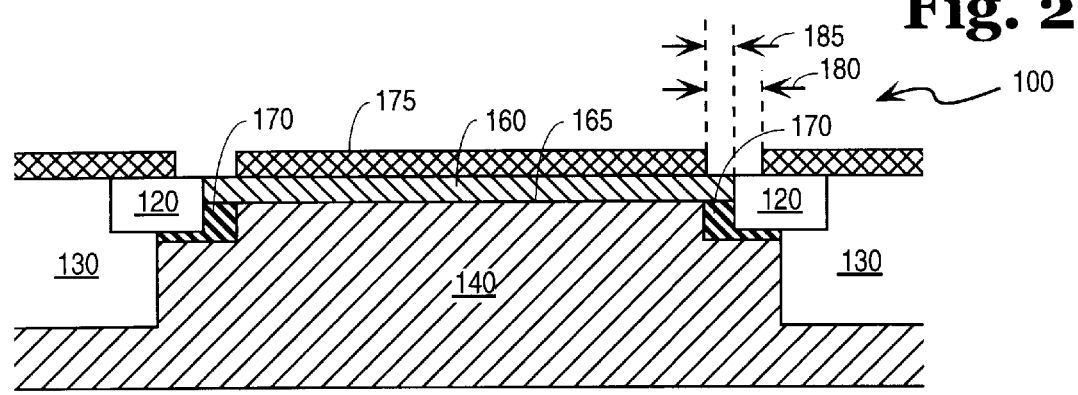
FIG. 3 shows the structure of FIG. 1 after the further processing step of forming buffer regions in the substrate through a mask.

FIG. 3 shows the structure of FIG. 2 after the further processing step of masking a top surface of substrate 110 and implanting buffer regions 170 in active area 105. Buffer regions 170 are formed adjacent STI isolation boundaries 120, and extend about the vertical distance, about the horizontal distance, and about the lateral distance of STI isolation boundaries 120 into substrate 110, and are substantially adjacent STI isolation boundaries 120 so as not to reduce the surface area of depletion region 140. In one embodiment, buffer regions 170 are formed of an N-type dopant, such as an N-type dopant having a tip or lightly doped drain implant chemistry (e.g., phosphorous concentration of $1 \times 10^{17}$–$5 \times 10^{18}$ atoms/cm$^3$) similar to N-type diffusion region 160. Buffer regions 170 are implanted at an energy sufficient to implant the dopant at a depth equal to or below STI isolation boundaries 120 and, in one embodiment, to envelope the horizontal and lateral components of STI isolation boundaries 120 in active area 105. For STI isolation boundaries having a depth (thickness) in the substrate of 4000 Å, the implantation energy should be sufficient to implant buffer regions to a 4000 Å depth (thickness) or greater. In accordance with one embodiment of the invention, buffer regions 170 are formed through dedicated masking layer 175 defining a region in active area 105 adjacent STI isolation boundaries 120. A suitable masking layer is, for example, a photoresist. Masking layer 175 has openings formed on the surface of substrate 110 about STI isolation boundaries 120 to define buffer region 170 adjacent STI isolation boundaries 120. In one example, a masking layer having openings 180 over a portion of STI isolation boundaries 120 and a portion of active area 105 are approximately 0.72 µm, with opening portions 185 extending over active area 105 of approximately 0.36 µm.

Figure 4:
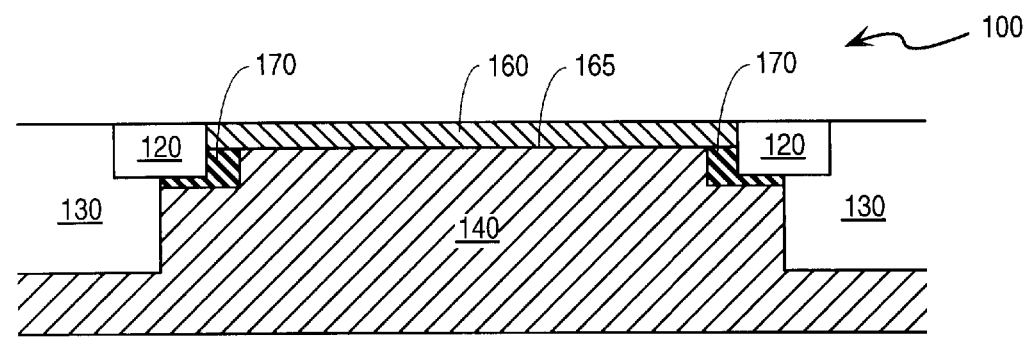
FIG. 4 shows the structure of FIG. 1 after the further processing step of removing the mask to yield an N-P photodiode circuit according to an embodiment of the invention.

FIG. 4 shows the structure of FIG. 1 after removal of masking layer 175 to display an embodiment of N-P photodiode circuit 100 according to the invention. The photodiode circuit 100 includes buffer region 170 formed about STI isolation boundary 120 to reduce leakage current emanating from the region adjacent STI isolation boundary 120.

Figure 5:
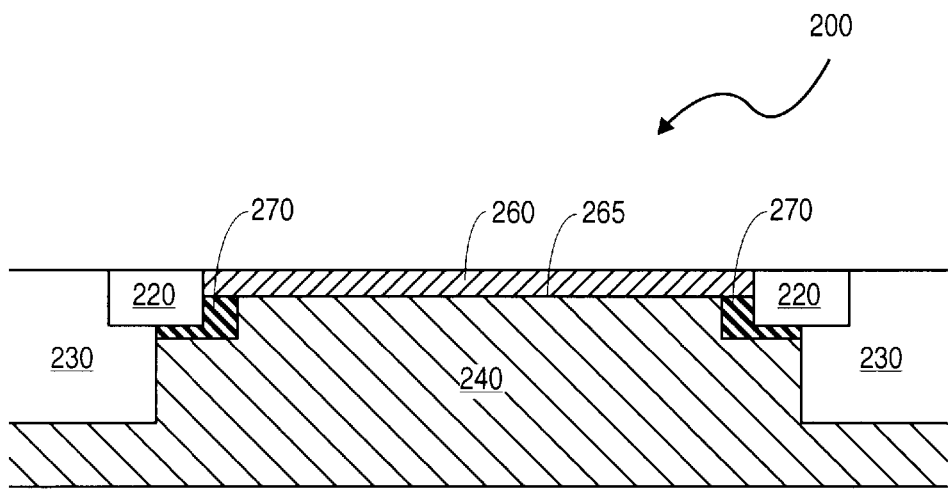
FIG. 5 shows a cross-sectional side view of a P-N photodiode circuit according to an embodiment of the invention.

It is to be appreciated that the invention is not limited to a particular photodiode circuit such as an N-P photodiode circuit. FIG. 5 shows a second photodiode circuit of the invention formed according to the techniques described above, that is a P-N photodiode circuit 200. Photodiode circuit 200 includes STI isolation boundaries 220, N-wells 230, N-type depletion region 240, P-type diffusion region 260, junction 265, and P-type buffer regions 270. It is also to be appreciated, that the invention is suitable for photodiode circuits formed in accordance with shallow trench boundary isolation but should not be limited therethrough. Other isolation regions, for example, such as Local Oxidation of Silicon Oxidation structures (LOCOS) may also be utilized.

In the preceding detailed description, the invention is described with reference to specific embodiments thereof. It will, however, be evident that various modifications and changes may be made thereto without departing from the broader spirit and scope of the invention as set forth in the claims. The specification and drawings are, accordingly, to be regarded in an illustrative rather than a restrictive sense.

What is claimed is:

1. A method comprising:
    forming a primary junction in an active area of a semiconductor substrate defined by an isolation boundary, the primary junction having a depth to collect electron/hole pairs formed in the active area; and
    forming a buffer region in the active area adjacent the isolation boundary and at least equal to the depth of the isolation boundary, the buffer region having a conductivity type similar to a conductivity type of a surface side of the primary junction.

2. The method of claim 1, wherein the surface side of the primary junction comprises a first conductivity, the primary junction formed at the interface between the first conductivity type and an area comprising a second conductivity type, and forming the buffer region comprises isolating the isolation boundary from the area comprising the second conductivity type.

3. The method of claim 2, wherein the isolation boundary is a dielectric trench.

4. The method of claim 1, further comprising:
    forming a depletion region in the active area subjacent the primary junction,
    wherein the primary junction depth comprises a depth such that the electron/hole pairs are generated within one of the depletion region and a diffusion length of the depletion region.

* * * * *

UNITED STATES PATENT AND TRADEMARK OFFICE
CERTIFICATE OF CORRECTION

PATENT NO. : 6,372,607 B1
DATED : April 16, 2002
INVENTOR(S) : Landau

It is certified that error appears in the above-identified patent and that said Letters Patent is hereby corrected as shown below:

<u>Column 2,</u>
Line 32, delete "isolation a boundaries" and insert -- isolation boundaries --.
Line 40, at the beginning of the sentence, insert -- In a first step of forming a diode junction, --.
Line 41, delete "105 a P-type substrate" and insert -- 105 of the depletion region 140 is a substrate 150 --.

Signed and Sealed this

Fourth Day of February, 2003

JAMES E. ROGAN
*Director of the United States Patent and Trademark Office*